United States Patent [19]
Jones et al.

[11] Patent Number: 5,329,097
[45] Date of Patent: Jul. 12, 1994

[54] COMPACT SUBSTRATE HEATER FOR USE IN AN OXIDIZING ATMOSPHERE

[75] Inventors: Thomas E. Jones, Spring Valley; Wayne C. McGinnis, San Diego; J. Scott Briggs, Carlsbad, all of Calif.

[73] Assignee: The United States of America as represented by the Secretary of the Navy, Washington, D.C.

[21] Appl. No.: 63,970

[22] Filed: May 19, 1993

[51] Int. Cl.$^5$ ............... H01L 21/20; H05B 3/00
[52] U.S. Cl. .................. 219/530; 219/459; 219/462; 118/725; 118/500
[58] Field of Search ............... 219/530, 540, 526, 459, 219/462; 118/724, 725, 728, 730, 50.1; 427/592, 587, 545; 392/416, 418

[56] References Cited

U.S. PATENT DOCUMENTS

| | | | |
|---|---|---|---|
| 2,651,236 | 9/1953 | Kahler | 219/530 |
| 4,278,877 | 7/1981 | Werych | 219/462 |
| 4,326,122 | 4/1982 | McCulloch et al. | 219/544 |
| 4,492,852 | 1/1985 | Finegan et al. | 219/411 |
| 4,512,391 | 4/1985 | Harra | 118/725 |
| 4,625,098 | 11/1986 | Joe | 219/530 |
| 4,777,022 | 10/1988 | Boldish et al. | 118/725 |
| 4,944,860 | 7/1990 | Branhall, Jr. et al. | 118/500 |
| 5,093,557 | 3/1992 | Lok et al. | 219/411 |
| 5,226,383 | 7/1993 | Bhat | 118/500 |

FOREIGN PATENT DOCUMENTS

| | | | |
|---|---|---|---|
| 2671446 | 7/1992 | France | 118/725 |
| 60-184677 | 9/1985 | Japan . | |
| 63-43312 | 2/1988 | Japan . | |
| 3-65590 | 3/1991 | Japan | 118/725 |

OTHER PUBLICATIONS

"A Substrate Heater Design for High Temperature Deposition In an Oxidizing Plasma", E. E. Inameti et al., Department of Electrical and Electronic Engineering, Univ. of Nottingham, Nottingham UK, *Vacuum*, vol. 43, No. 1, pp. 121-123, 1992.

"A Simple Vacuum System Substrate Heater", Robert J. Mattauch, Univ. of Virginia, Charlottesville, Virginia, *the Review of Scientific Instruments*, vol. 43, No. 1, Jan. 1972.

Shop Notes, "Inexpensive Radiant Substrate Heater for Vacuum Use", D. M. Hoffman et al., RCA Laboratories, Princeton, New Jersey, *J. Vac. Sci. Tech.*, vol. 13, No. 2, Mar./Apr. 1976.

"Heater for High $T_c$ Oxide Superconducting Thin-Film Deposition", B. Oh et al., IBM Research Div., New York, *Rev. Sci. Instrum.* 62(12), Dec. 1991.

Primary Examiner—Bruce A. Reynolds
Assistant Examiner—John A. Jeffery
Attorney, Agent, or Firm—Harvey Fendelman; Thomas Glenn Keough

[57] ABSTRACT

A compact heater is designed for the deposition of thin films at high temperatures in an oxidizing atmosphere or in vacuum. The heater is designed to accommodate a small-diameter load-lock system in an ultra-high-vacuum deposition chamber, and can operate in 0 to 1 atmosphere of oxygen up to at least 800° C. The compact design allows the heater, including a substantially isothermal substrate holder having the substrate affixed thereto, included temperature sensor and attached main body portion, to be loaded through a load-lock port with about a 2.5 inch inside diameter. Heat is generated resistively, and the substrates are heated directly by thermal conduction. The heater was designed specifically to heat substrates to precisely monitored temperatures during the growth of high-temperature superconducting thin films.

10 Claims, 2 Drawing Sheets

COMPACT SUBSTRATE HEATER FOR USE IN AN OXIDIZING ATMOSPHERE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Heating substrates during the growth of thin films in vacuum chambers, such as electronic and optical films, often is difficult. The heaters in systems designed for thin-film growth by evaporation, ion-sputtering, molecular beam epitaxy, and laser ablation, for example, are often the most fragile and failure-prone subsystems in the process. The heater deficiency has been prevalent even though most films are grown either under high-vacuum conditions or in a partial pressure of an inert gas such as argon. Such inert atmospheres are usually the best environments for maximizing the lifetime of heating wires and fixtures.

The discovery and continuing research into high-temperature superconducting thin films has put additional constraints on the operation of vacuum system heaters primarily because the new superconductors, such as $YBa_2Cu_3O_7$, $Bi_2Sr_2CaCu_2O_8$, and $Bi_2Sr_2Ca_2Cu_3O_{10}$, are oxides. These oxides are impossible to make in a true high-vacuum environment since molecular oxygen ($O_2$) at partial pressures of at least 10 milliTorr must be present during growth to foster the formation of these compounds in the proper crystalline phase. For example, oxygen partial pressures up to 0.5 Torr, and temperatures in excess of 700° C. are typical deposition conditions used for the growth of these materials. Following deposition, the films are usually cooled from the growth temperature at oxygen pressures of a few hundred Torr. An anneal at 400°–500° C. in one atmosphere of oxygen completes the process. Oxygen partial pressures over $10^{-4}$ Torr usually cause severe problems for most heater materials heated to such high temperatures.

In many contemporary vacuum-chamber heaters, heat is transferred to the substrate by infrared radiation. The source of infrared radiation may be a sealed quartz lamp, see R. J. Mattauch, *Rev. Sci. Instrum*, vol. 43, 1972, p. 148, or heated tungsten or platinum windings, see D. M. Hoffman and F. J. Tams III, *Journal of Vac. Soc. Technol.*, vol. 13, 1976, p. 647, for example. A major disadvantage with such a design, especially for the growth of high-$T_c$ superconductors, is that most of the substrates of choice are transparent to visible light, and poor absorbers of infrared radiation. Without an intermediate heat absorber, this method can result in very inefficient heating of the substrates, and also very large errors in thermometry, especially if pyrometric temperature measurement techniques are relied upon.

Thus, in accordance with this inventive concept a need has been recognized for a high temperature substrate heater for depositing thin films in an oxidizing atmosphere that heats by direct thermal conduction and which is resistant to oxidation at high temperatures.

SUMMARY OF THE INVENTION

The present invention is directed to providing a substrate heater for the growing of at least one thin film on a substrate in an oxidizing atmosphere. A heating element is fabricated from a material having resistive properties to provide sufficient heat to reach a desired operating temperature for the growing of at least one thin film on the substrate and a main body portion is provided with a surface to mount the heating element on it. The main body portion is fabricated from a material having the properties of being electrically insulating and of having a high thermal conductivity to assure thermal conduction of the sufficient heat. A substrate holder portion is fabricated from a material having a high thermal conductivity to assure uniform thermal conduction of the sufficient heat from the main body portion to the substrate holder. The substrate holder is shaped and disposed to accommodate at least a part of the main body portion in a contiguously abutting relationship. The substrate holder is further shaped to provide a flat substrate holder surface on which the substrate is affixed in a contiguously abutting relationship to assure the heating of the substrate by the direct uniform thermal conduction of the sufficient heat between the substrate holder and the substrate. A thermocouple is disposed in at least the substrate holder portion for providing signals representative of the temperature of the substrate holder portion. A power source is coupled to the heating element to assure that the sufficient heat is provided to reach the desired operating temperature for the growing of at least one thin film on the substrate.

An object of the invention is to provide a substrate heater for thin film deposition in an oxidizing atmosphere.

An object of the invention is to provide a substrate heater which is of compact size.

Another object is to provide a high temperature substrate heater in which heat is generated resistively.

Another object is to provide a high temperature substrate heater having efficient direct heating of a substrate.

Another object is to provide a high temperature substrate heater in which substrates are heated directly by thermal conduction rather than by radiation.

Another object is to provide a high temperature substrate heater in which substrates are efficiently heated by being directly heated through thermal conduction through a high thermal conductive substrate holder rather than by radiation.

Another object is to provide a high temperature substrate heater designed to withstand extremes in temperature and oxygen partial pressure.

Another object is to provide a high temperature substrate heater for a load-locked ultra-high-vacuum deposition system.

Another object is to provide a high temperature substrate heater that allows the temperature of a substrate holder being heated to be accurately monitored and controlled.

Another object is to provide a high temperature substrate heater to allow high temperature operation in an oxygen rich environment.

Another object is to provide a high temperature substrate heater having a thermal uniformity across a flat substrate holder surface to assure a more uniform processing of a substrate mounted thereon.

Another object is to provide a high temperature substrate heater having the capability for accurately determining the temperature of a substrate holder and the substrate.

These and other objects of the invention will become more readily apparent from the ensuing specification and drawings when taken in conjunction with the attached claims.

DESCRIPTION OF THE PREFERRED EMBODIMENT

Figure 1:
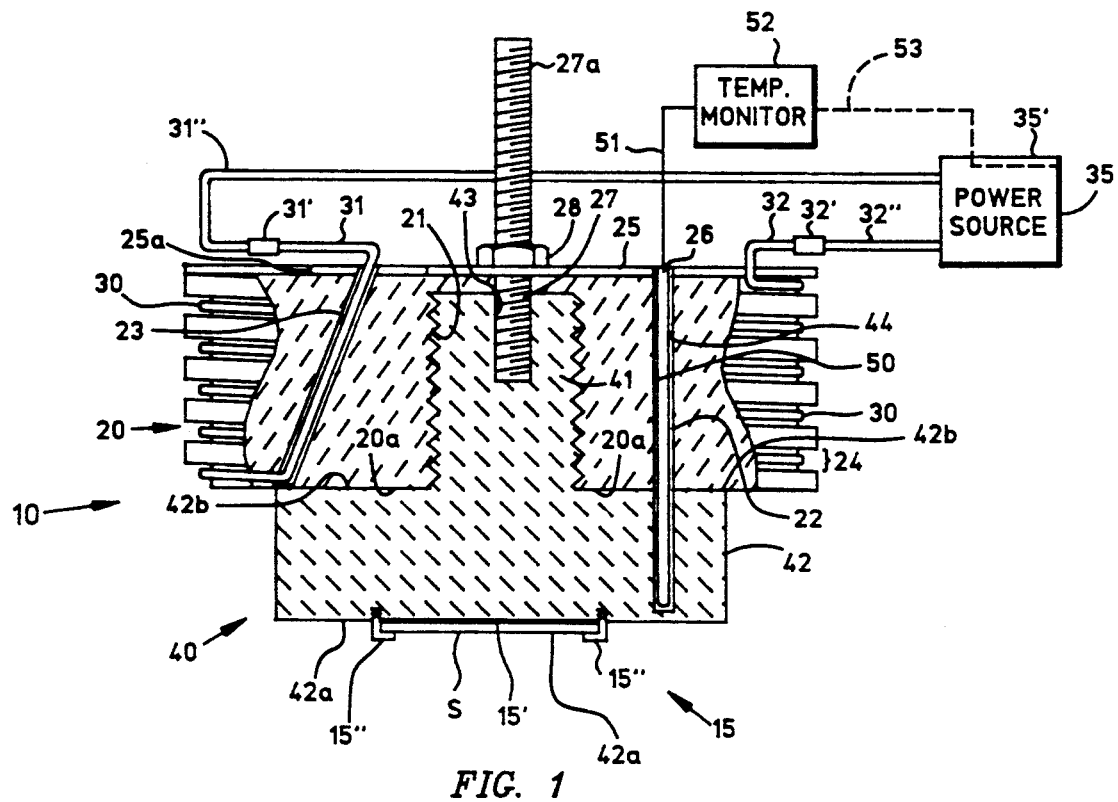
FIG. 1 is a schematic side view depiction of the heater in accordance with this inventive concept, taken partially in cross section.
Figure 2:
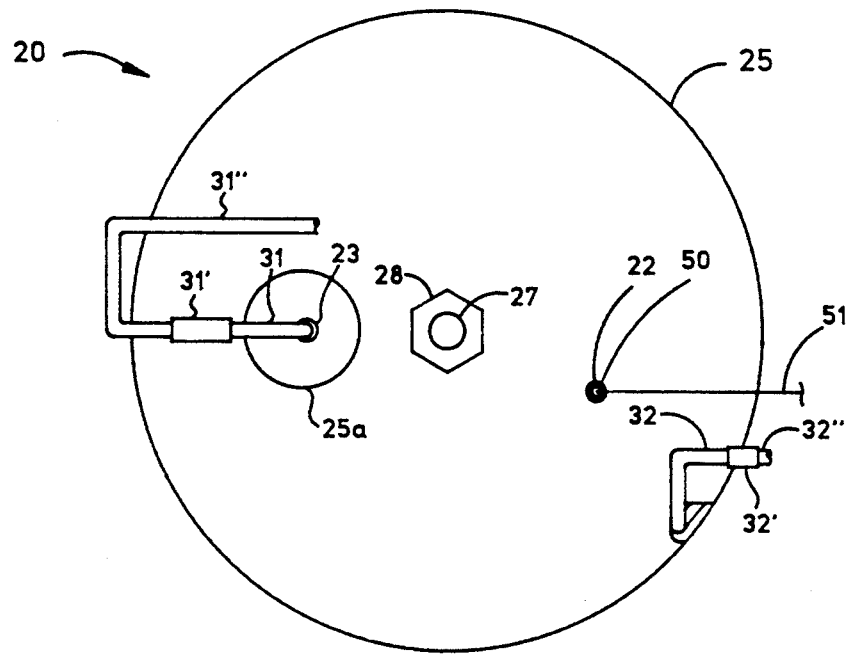
FIG. 2 is a top view of FIG. 1 that more particularly shows the relative location of certain constituents of the invention.

Referring now to FIGS. 1 and 2 of the drawings, a substrate heater 10 is shown operatively associated with a substrate S to be processed to uniformly effect a heat transfer therebetween. The substrate is securely held or otherwise suitably affixed to the substrate heater by an appropriate securing means 15, such as a film 15' of a bonding agent disposed between the substrate heater and the substrate or a clamping mechanism 15" or other suitable means that securely holds the substrate in a contiguously abutting relationship on the substrate heater.

The substrate heater includes a main body portion 20 that is provided with a main body bearing portion 20a, a cavity in the form of a threaded central bore 21, a traverse thermocouple bore 22 and a oblique bore 23. In addition, a helical groove 24 is machined in the outer surface of the main body portion. As will be apparent to one skilled in the art to which this invention pertains, other configurations of grooves such as multiple helical grooves, etc. might be provided as well as the situation calls for. The main body portion has an essentially cylindrical configuration, although other shapes, including a variety of geometrical forms could be chosen. A retaining disk 25 having a thermocouple hole 26 is provided to function as a reinforcement for the main body portion when held in place by a retaining bolt 27 and retaining bolt nut 28. The retaining bolt may be provided with an elongated portion 27a, as shown, to allow substrate heater 10 with substrate S to be attached to an appropriate mounting surface or structure in a processing system. Other means of attaching the substrate heater with a substrate in a processing system can be employed as will be apparent to one skilled in the art to which this invention pertains.

The substrate heater further includes a helically extending heating element 30 that is wound or otherwise fitted in single or multiple turns into the helical groove or other groove configurations. In the case of a helically extending heating element a first end 31 of helically extending heating element 30 extends through oblique bore 23 through an opening 25a in a disk 25. The other end 32 of helically extending heating element 30 is brought to extend above the top of retaining disk 25 on the main body portion. Both of the ends may be coupled by crimps 31' and 32' (or other suitable releasable interconnections) to appropriate lengths of conductors 31" and 32" that reach to a suitable remote power source 35 which provides sufficient power to responsively energize the helically extending heating element.

A substrate holder portion 40 of the substrate heater is shaped to fit into and accommodate main body portion 20 in a tight, contiguously abutting relationship to assure the transfer of heat therebetween. The substrate holder is machined with a projecting, or threaded portion 41 with the threads being configured to fit into or mate with threads 21 of the main body portion and a cylinder portion 42 having a flat substrate holder surface 42a on which substrate S is affixed and a substrate holder bearing portion 42b. The threaded portion 41 and substrate holder bearing portion 42b of cylinder portion 42 abuttingly mate with threaded central bore 21 and main body bearing portion 20a of main body portion 20 to provide the tight, contiguously abutting relationship to assure the transfer of heat therebetween. A threaded bore 43 in threaded portion 41 receives retaining bolt 27 with a nut 28 to secure retaining disk 25 on main body portion 20 to provide reinforcement for the main body portion.

Substrate holder 40 is further provided with a partial lateral thermocouple bore 44 that extends partially across cylinder portion 42. The partial lateral thermocouple bore 44, traverse thermocouple bore 22 and thermocouple hole 26 are aligned to receive a thermocouple 50. A remotely extending pair of leads 51 provides accurate readings of temperature from thermocouple 50 to a remote temperature monitor 52. The temperature monitor is operatively associated with a temperature controller 35', such as a suitable motor controlled rheostat, for example, for appropriately controlling the power from source 35 to the heater element and, hence its output heating power. The readings provided are of the temperature of cylinder portion 42 to which substrate S is contiguously and securely affixed on substrate holder surface 42a.

A heater fabricated according to the foregoing easily is scaled in size to accommodate any vacuum system. The compact design shown in FIGS. 1 and 2 was designed for use in an ultra-high-vacuum ion-beam sputter deposition system with a load-lock entry system. Use of the heater, however, is not limited to such a system. A load-lock port, while facilitating the loading and unloading of substrates, imposes severe constraints on a heater system which is brought in and out with the substrate. In particular, the size of the heater is usually severely restricted, and the electrical contacts to conductors 31' and 32' and thermocouple connections to the heater assembly must be made and broken within the evacuated chamber. That is, the connections cannot be hard-wired if the heater, with attached substrate, is to be brought in and out of the vacuum chamber through a load-lock.

The materials chosen for the components of substrate heater 10, as well as some design features, are key to its operation at high temperatures and in oxygen. Main body portion 20 of the substrate heater is fabricated from boron nitride (BN). This synthetic material, an analogue of graphite, is commercially available from the Carborundum Company (Boron Nitride Division, 168 Creekside Drive, Amherst, N.Y. 14228). BN has several unique features that are critical to the success of the substrate heater. BN has a high thermal conductivity so that, when heated, the heat is readily conducted to the substrate. High thermal conductivity, in the context of the use of the term in regard to the main body portion, means having a value greater than 15 W/m/K (at temperatures between 25° C. and 1000° C.). High electrical resistivity in the context of the use of the term in regard to the main body portion, means having a value greater than 0.1 ohm cm (at 25° C.) which is high enough with respect to the resistivity of the heating element to assure that essentially all of the current supplied by the power supply goes through the heating element. BN has a sufficiently high electrical resistivity so that the heater wires of helically extending heating element 30 wrapped around the BN main body portion in helical groove 24 are naturally insulated and cannot short electrically through the BN body. BN is also resistant to oxidation, being capable of withstanding temperatures of approximately 1000° C. in oxygen. Finally, BN is easily machined, so it is possible to fixture other components to it after conventional machining, such as by drilling and tapping threads, and machining grooves for the heater wire. Having the teachings set forth herein, other suitable materials, other than the BN material, will readily suggest themselves to one of ordinary skill in the art which provide the enumerated relied upon properties and functional interrelationships.

Helically extending heating element 30 may be an 18 gauge (1 mm diameter) Kanthal AF or A-1 wire, for example. Kanthal wire, an alloy of mainly iron, chromium, and aluminum, is available commercially from Kanthal Corporation (Kanthal Corporation, 119 Wooster St., PO Box 281, Bethel, Conn. 06801-0281). Two features of Kanthal wire are noteworthy for this application. First, Kanthal wire has a high resistivity so that only short lengths are necessary to make a suitable heating element. Second, Kanthal forms a protective natural oxide barrier so that it can operate effectively in an oxygen atmosphere. In fact, when used in a reducing atmosphere (such as $N_2$ or Ar), the manufacturer recommends occasionally heat treating the wire at 1050° C. in air for 7 to 10 hours to maintain the protective oxide layer, see Kanthal Handbook, *Resistive Heating Alloys and Elements for Industrial Furnaces*, Kanthal AB, Sweden, 1989, p. 10. Such a pre-oxidizing treatment also prevents the wire from fusing when heated in a vacuum. The heating element for the helically extending heating element described herein was pre-oxidized in this way. An appropriate electrical resistivity in the context of the use of the term in regard to the heating element would be between $10^{-4}$ and $2\times10^{-2}$ ohm cm at 25° C. The lengths, gauge and winding pattern of the helically extending heating element are modifiable by a routineer to accommodate a particular processing application. Furthermore, in the light of the teachings set forth herein, other suitable materials, other than the Kanthal wire, will readily suggest themselves to one of ordinary skill in the art which provide the enumerated relied upon properties and functional interrelationships.

Substrate holder 40 is fabricated from a high thermal conductivity material, such as Haynes alloy no. 214. This alloy of mainly nickel, chromium, and aluminum is commercially available from Haynes International, Inc. (1020 W. Park Ave., PO Box 9013, Kokomo Ind. 46904-9013). The Haynes alloy is also a material that develops a protective oxide layer when heated in oxygen, thus being very resistant to the degradation effects of oxidation. High thermal conductivity, in the context of the use of the term in regard to the substrate holder, means having a value greater than 25 W/m/K between 700° C. and 1000° C. As illustrated in FIG. 1, the substrate holder is machined as a threaded portion 41 and a cylinder portion 42. The threaded portion is then threaded into the BN material of main body portion 20, as shown. Retaining disk 25 also is fabricated from Haynes alloy and serves to reinforce the structure of the main body portion, as the BN material is not as strong as the metal components.

The key materials used in this design (BN, Kanthal, and Haynes alloy) have been used in other heater designs, see Charles K. C. Lok and August O. Western, U.S. Pat. No. 5,093,557, Mar. 3, 1992; and B. Oh and R. P. Robertazzi, *Rev. Sci. Instrum.* vol. 62, no. 12, 1991, p. 3104; especially since the advent of high-$T_c$ superconductors. Another unique feature of the present design in accordance with this invention, however, in addition to its compact size (about 3.2 cm diameter and 1.8 cm in length to hold a nearly 2.4 cm diameter substrate), is that it allows the Haynes alloy substrate holder 40 to be heated directly via thermal conduction through the BN main body portion 20. There is no need to electrically insulate or physically separate substrate holder 40 from the heating element with insulators such as quartz, sapphire, or ceramic sheet. The Haynes alloy substrate holder 40 threads directly into the electrically insulating, but thermally conducting BN main body portion 20.

Thermocouple 50 is fed through the aligned partial lateral thermocouple bore 44 in the Haynes alloy substrate holder 40, traverse thermocouple bore 22 in the BN main body portion 20 and thermocouple hole 26 in the Haynes alloy retaining disk 25. Thusly disposed, thermocouple 50 provides for the measurement of the substrate holder temperature at monitor 52, which, with temperature controller 35' operatively associated with monitor 52 and power supply 35, can be used in a feedback loop 53 with the power supply 35 of helically extending heating element 30 to control the temperature of the substrate.

Other components of a fixturing assembly, not shown, may be provided at the top of the substrate heater possibly connected to bolt 27 which also are used to fixture the whole substrate heater 10 in the vacuum system. All metal parts in this fixturing assembly might be fabricated out of Haynes alloy as well, including the threaded rods and nuts required for assembly. A laterally extending alumina disk might be carried on bolt 27 of substrate heater 10 to insulate it, both electrically and thermally, from other components of the system. Holes might be provided in the alumina disk to accommodate heater and thermocouple connectors which mate to similar connectors in the vacuum chamber. In the present design, short pieces of 1 mm diameter platinum wire were used as conductors 31" and 32" to electrically link the ends 31 and 32 of the Kanthal wire to power supply 35. The wires were are joined by the suitable interconnections of wrapping platinum foil around the overlapping wire ends, and crimping the combination inside a small piece of stainless steel tubing. The platinum wire is much more flexible than the Kanthal, and, therefore, easier to route to the other connectors, while at the same time it is much less resistive, and thus does not heat up as much as the Kanthal.

Although the disclosed embodiment refers to specific dimensions to accommodate a substrate, it must be understood that these dimensions are intended to be demonstrative of a unique feature of the invention, that being its small size that allows its introduction into a processing chamber with a substrate attached. This capability avoids needless handling of the substrate and helps prevent damage to the relatively fragile substrate which otherwise is very susceptible to being damaged during the multiple handling of the substrate using conventional substrate heaters in processing. One skilled in the art to which this invention pertains could change the dimensions, as well as other parameters, within the scope of this invention as a particular application makes itself known.

Power supply 35 may be direct current (DC) or alternating current (AC), the nature of the power source is immaterial to provide driving current I, through the Kanthal wire of helically extending heating element 30 having a resistance R. Heating power P, for substrate S, is generated simply by resistive heating: $P=I^2R$. Sufficient current must be supplied to reach the desired operating temperature for the processing of the substrate, but such that the current-carrying capacity of the wire of helically extending heating element 30 not be exceeded. The heat generated by helically extending heating element is conducted through the BN main body portion 20 by direct thermal conduction to the Haynes substrate holder 40. Substrate S, on which the film is to be deposited, can be contiguously attached to the Haynes substrate holder in a number of ways. Simply using a light coat 15' of silver paint or paste to glue or bond the substrate in place works very well and is relatively easy to remove after film deposition. The silver paint may be baked out at 250-300° C. to secure the substrate before loading the substrate into the vacuum chamber. Silver epoxy or high-temperature ceramic adhesive could be substituted. Fixturing clips 15" can also be used to simply hold the substrate tightly against the Haynes substrate holder. However, this technique may be less efficient in conducting heat to the substrate and may result in the greater uncertainty as to the actual substrate temperature. A variation of this method is to sandwich a thin piece of silver foil between the clip-held substrate and the heater surface.

It is prudent to calibrate such a heater so that the true substrate temperature is known with a minimum uncertainty. A working thermometer using this substrate heater is thermocouple 50 inserted in a hole as disclosed above to extend into the Haynes alloy substrate holder 40. This location of the thermocouple relies on the metallic alloy of the substrate holder functioning as a good black-body in steady-state radiation balance with the thermocouple. To check this methodology, two additional thermocouples were silver-paint bonded to the Haynes alloy substrate holder 40. One of the additional thermocouples was bonded directly to the substrate holder, and the other was bonded to a small 0.5 mm thick piece of SrTiO$_3$ (a typical substrate material for YBa$_2$Cu$_3$O$_7$ films) that was in turn silver-paint bonded to the substrate holder.

Figure 3:
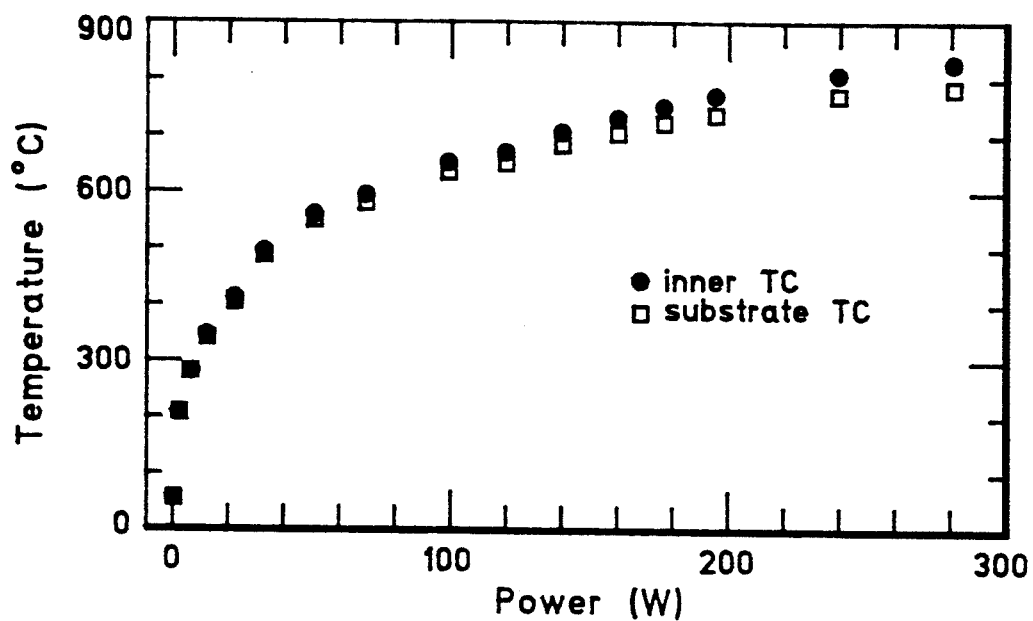
FIG. 3 graphically shows temperature measured with a thermocouple bonded to the substrate (substrate TC) and a thermocouple inserted in a hole in the Haynes substrate holder (inner TC).

Substrate heater 10 was operated under typical deposition conditions in a vacuum chamber with a total gas pressure of 1 milliTorr. The results of the calibration are shown in FIG. 3. The temperatures were measured using chromel-alumel thermocouples. The abscissa is the RMS input power supplied by an AC voltage source at 60 Hz. The temperature readings for the thermocouple bonded directly to substrate holder 40 (substrate TC) were substantially the same as those for the thermocouple inserted in the partial lateral thermocouple bore 44 through traverse thermocouple bore 22 and thermocouple hole 26 (inner TC). The resistance of the short Kanthal heating element of helically extending heating element 30 used for this calibration was approximately 1 ohm. These temperatures also agreed with measurements taken using a two-color optical pyrometer.

During operation of substrate heater 10, the inner thermocouple 50, is monitored to achieve the desired substrate temperature. For example, from the calibration for the substrate heater, it was found that in order to achieve a substrate temperature of 700° C., the temperature of the thermocouple inside the Haynes holder should be maintained at 722° C. An empirically determined temperature correlation has thus been found to exist between the substrate holder temperature fabricated in accordance with this inventive concept and the substrate temperature to enable an operator to know the temperature of the substrate. Once calibration measurements have been made, the substrate temperature is known if the substrate holder temperature is measured.

Figure 4:
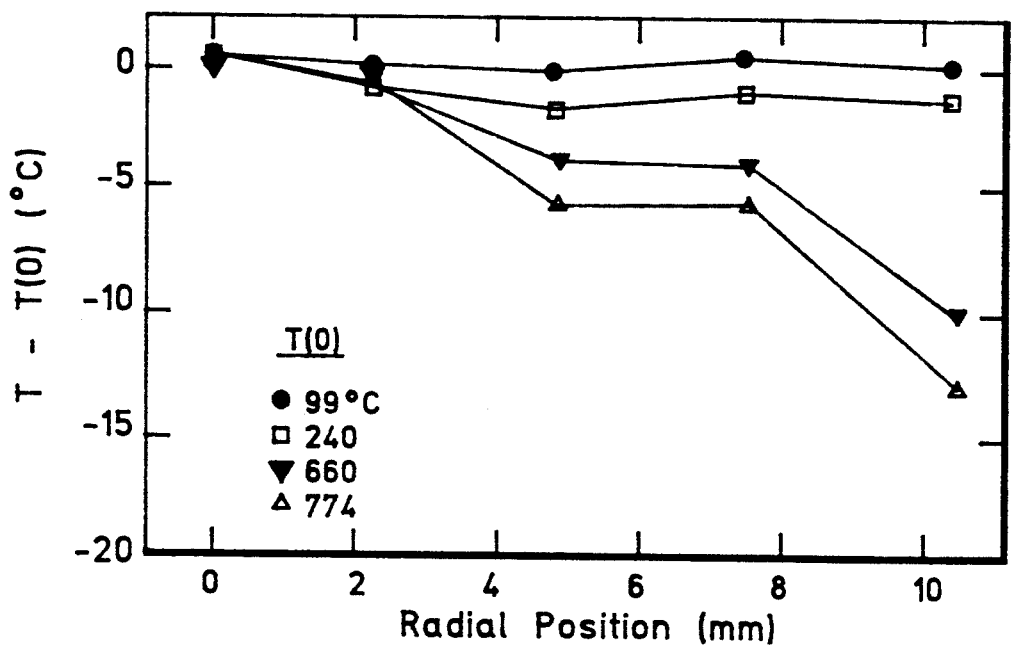
FIG. 4 graphically shows temperature profile measured in air across the Haynes substrate holder; zero position is the center of the substrate holder and the temperature at the center of the substrate holder is T(0)

To check the temperature uniformity across the relatively small 2.4 cm diameter of substrate holder 40, a number of chromel-alumel thermocouples were silver-paint bonded to substrate holder surface 42a at various radial positions. These measurements were performed in air with the heater casing, not shown, removed. The results are illustrated in FIG. 4, where the temperature profile across the Haynes substrate holder is shown for several temperatures. It is to be noted with the invention as disclosed herein, the substrate holder is as nearly as isothermal as practicable, in that the temperature profile variation from the center of substrate holder surface 42a is so slight, when compared to the applied temperature T(0) as to be practicably negligible. This capability, inherent in this invention assures a substantially uniform temperature across the substrate and a consequent uniformity in the processing or growing of a thin film on the substrate In accordance with the invention disclosed herein one skilled in the art to which this invention pertains would be apprised that there are many possible variations to the design specifically described. Aside from different geometries that would be obvious, different materials could be selected within the scope of this inventive concept and still maintain the basic concept. Other alloys besides Kanthal, such as wire made with Haynes alloy, could be used as the heating element. Sheathed nichrome wire could be used, see E. E. Inameti, M. S. Raven, Y. M. Wan, and B. G Murray, *Vacuum*, vol 43, 1992, p. 121 though outgassing might be a problem in an ultra-high-vacuum environment and the large size and bending radius of sheathed nichrome make it difficult to use in a small, compact heater design. Tantalum wire could be used in lower oxygen pressures (up to $5\times10^{-4}$ Torr). Platinum-rhodium alloys could also be used as the heating element. However, their lower resistivities make a small heater difficult to fabricate because it is difficult to achieve high resistance in the windings. The BN main body portion could be replaced but with some disadvantages. Other candidate materials would be other high thermal conductivity, low electrical conductivity materials, such as beryllia. Machinable ceramics or alumina could be used, though they are difficult to machine and don't have the high thermal conductivity of BN.

Obviously, many other modifications and variations of the present invention are possible in light of the above teachings. It is therefore to be understood that within the scope of the appended claims, the invention may be practiced otherwise than as specifically described.

We claim:

1. A substrate heater for growing at least one thin film on a substrate in an oxidizing atmosphere comprising:
   a heating element fabricated from a material having resistive properties to provide sufficient heat to reach a desired operating temperature to assure said growing said at least one thin film on said substrate;
   a main body portion provided with a surface to mount said heating element thereon, said main body portion being fabricated from a material having the properties of being electrically insulating and of having a high thermal conductivity to assure a thermal conduction of said sufficient heat; and
   a substrate holder portion fabricated from a material having a high thermal conductivity property to assure a uniform said thermal conduction of said sufficient heat from said main body portion to said substrate holder, said substrate holder being shaped and disposed to accommodate at least a part of said main body portion in a contiguously abutting relationship and further being shaped to provide a flat substrate holder surface on which said substrate is affixed in a contiguously abutting relationship to assure the direct said uniform said thermal conduction of said sufficient heat therebetween thereby permitting said growing said at least one thin film on said substrate.

2. A substrate heater according to claim 1 further including:
   a thermocouple disposed in thermal contact with said substrate holder portion to provide signals representative of the temperature of said substrate holder portion to a monitor.

3. A substrate heater according to claim 2 further including:
   a power source coupled to said heating element to assure that said sufficient heat is provided to reach said desired operating temperature thereby permitting said growing said at least one thin film on said substrate.

4. A substrate heater according to claim 3 further including:
   a feed-back circuit interconnecting a temperature controller and said power source to assure said desired operating temperature.

5. A substrate heater according to claim 4 further including:
   a retaining disk fabricated from a material having a high thermal conductivity property being secured to said main body member to provide reinforcement therefor.

6. A substrate heater according to claim 1, 2, 3, 4 or 5 in which said main body portion is provided with a cavity and a main body bearing portion and said substrate holder is provided with a projecting portion and a substrate holder bearing portion sized to fit into said cavity to provide said contiguously abutting relationship between said cavity and said projecting portion and between said main body bearing portion and said substrate holder bearing portion to assure the transfer of said sufficient heat therebetween.

7. A substrate heater according to claim 6 in which said cavity is threaded and said projecting portion is correspondingly threaded to mate with the threads in said cavity to help assure the transfer of said sufficient heat therebetween.

8. A substrate heater according to claim 7 in which said heating element, said main body portion and said substrate holder portion are sized to permit access through a load-lock port of a deposition system.

9. A substrate heater according to claim 8 in which said heating element, said main body portion and said substrate holder portion are fabricated from the materials boron nitride, Kanthal wire, and Haynes alloy, respectively.

10. A substrate heater according to claim 2 in which a bore is provided through said main body portion and partially through said substrate holder portion to receive said thermocouple therein.

* * * * *